(12) United States Patent
Schürz et al.

(10) Patent No.: US 7,259,504 B2
(45) Date of Patent: Aug. 21, 2007

(54) PIEZOELECTRIC ACTUATOR

(75) Inventors: Willibald Schürz, Pielenhofen (DE); Martin Simmet, Bad Abbach (DE)

(73) Assignee: Siemens Aktiengesellschaft, Munich (DE)

( * ) Notice: Subject to any disclaimer, the term of this patent is extended or adjusted under 35 U.S.C. 154(b) by 158 days.

(21) Appl. No.: 10/526,340

(22) PCT Filed: Aug. 13, 2003

(86) PCT No.: PCT/DE03/02730

§ 371 (c)(1),
(2), (4) Date: Mar. 2, 2005

(87) PCT Pub. No.: WO2004/027887

PCT Pub. Date: Apr. 1, 2004

(65) Prior Publication Data

US 2006/0066182 A1     Mar. 30, 2006

(30) Foreign Application Priority Data

Sep. 11, 2002 (DE) ............................... 102 41 992

(51) Int. Cl.
*H01L 41/047* (2006.01)
(52) U.S. Cl. ....................... 310/365; 310/366; 310/328
(58) Field of Classification Search ............... 310/328, 310/363–366
See application file for complete search history.

(56) References Cited

U.S. PATENT DOCUMENTS

| 6,208,026 | B1 | 3/2001 | Binding et al. | |
|---|---|---|---|---|
| 6,411,018 | B1 | 6/2002 | Heinz | |
| 6,528,927 | B1 | 3/2003 | Schuh et al. | |
| 6,573,639 | B1 | 6/2003 | Heinz et al. | |
| 6,700,306 | B2 * | 3/2004 | Nakamura et al. | 310/328 |
| 6,765,337 | B1 * | 7/2004 | Heinz et al. | 310/328 |
| 6,794,800 | B1 | 9/2004 | Heinz | |
| 2001/0047796 | A1 | 12/2001 | Yamada et al. | |

(Continued)

FOREIGN PATENT DOCUMENTS

DE     196 48 545 A1     5/1998

(Continued)

*Primary Examiner*—Darren Schuberg
*Assistant Examiner*—J. San Martin
(74) *Attorney, Agent, or Firm*—Laurence A. Greenberg; Werner H. Stemer; Ralph E. Locher

(57) ABSTRACT

The invention relates to a piezoelectric actuator (1) comprising a stack of a plurality of individual piezoelectric actuator elements (2, 2', 2'') which are arranged between inner electrodes (3, 3', 3''). Said piezoelectric actuator comprises a first metallisation strip (4) and a second metallisation strip (5), the inner electrodes (3, 3', 3'') being respectively connected to the first or second metallisation strips (4, 5) in an alternating manner. A first outer electrode (6) and a second outer electrode (7) are fixed to the first or the second metallisation strips (4, 5) in order to electrically contact the piezoelectric actuator (1). Said outer electrodes (6, 7) respectively comprise a connection element (8, 9) for externally contacting the piezoelectric actuator (1), and at least one region which is embodied in such a way that it compensates length variations of the piezoelectric actuator (1) in the main oscillation direction (10) as a result of its design and arrangement. The elastic deformation exclusively extends inside a plane which is parallel to the main oscillation direction (10).

10 Claims, 4 Drawing Sheets

U.S. PATENT DOCUMENTS

| | | | |
|---|---|---|---|
| 2006/0022558 A1* | 2/2006 | Bindig et al. | 310/366 |
| 2006/0055288 A1* | 3/2006 | Heinzmann et al. | 310/364 |

FOREIGN PATENT DOCUMENTS

| | | |
|---|---|---|
| DE | 199 13 271 A1 | 9/2000 |
| DE | 199 17 728 A1 | 10/2000 |
| DE | 199 28 780 A1 | 1/2001 |
| DE | 199 28 189 A1 | 4/2001 |
| DE | 100 17 975 A1 | 10/2001 |
| DE | 101 13 744 A1 | 6/2002 |
| EP | 1 065 735 A2 | 1/2001 |
| JP | 08242025 | 9/1996 |
| JP | 09270539 | 10/1997 |
| JP | 2002202024 | 7/2002 |

* cited by examiner

PIEZOELECTRIC ACTUATOR

BACKGROUND OF THE INVENTION

Field of the Invention

The invention relates to a piezoelectric actuator with:

a stack of a plurality of individual piezoelectric actuator elements, which are disposed between inner electrodes and which contract or expand in a main oscillation direction in dependence on an applied electric voltage, a first metallization strip and a second metallization strip, the inner electrodes being respectively connected in an alternating manner to the first or second metallization strip, a first outer electrode and a second outer electrode which are respectively fixed to the first or the second metallization strip in order to electrically contact the piezoelectric actuator and a first connection element and a second connection element for externally contacting the piezoelectric actuator which are respectively connected to the first or the second outer electrode.

Generic piezoelectric actuators are often used to control injection valves in motor vehicles.

Piezoceramics have the property of expanding or contracting when an electric voltage is applied, depending on the polarity of the voltage. This effect is utilized in piezoelectric actuators. However, the effective linear expansion is less than 0.2 percent of the layer thickness of the piezoceramic along the principal axis. At the same time, the electric voltage necessary to operate the piezoelement rises as the layer thickness of the piezoelement increases. In order to keep the voltage within bounds and at the same time to achieve technically meaningful linear expansion, a plurality of piezoceramic layers are usually arranged on top of each other. The individual piezoceramic layers, which hereinafter are referred to as piezoelectric actuator elements, are provided with metal inner electrodes on both sides for polarization.

A piezoelectric actuator which has two metallization strips to electrically contact the piezoelectric actuator elements on its outer side is already known from DE 196 48 545 A1. The inner electrodes are respectively connected in an alternating manner to one of the two metallization strips and electrically switched in parallel via outer electrodes. To this end, the outer electrodes have connection elements for externally contacting the piezoelectric actuator.

On account of the high dynamic load of the piezoelectric actuator, cracks may occur in the ceramic. The metallization strip may be split as a result. On the cracked edge this leads to arcing which leads to destruction of the piezoelectric actuator.

To avoid failures of the piezoelectric actuator with dynamic loads, DE 196 48 545 A1 proposes the provision of three-dimensionally structured, electrically conductive electrodes between the metallization strips and the outer contact which are connected to the metallization strips via partial points of contact and are designed to be expandable between the points of contact.

On account of the increasingly confined space in the engine compartment, however, there is less and less room for the individual engine components.

SUMMARY OF THE INVENTION

The object of the invention is therefore to improve a piezoelectric actuator according to the preamble of claim 1 in such a way that a secure electrical contact is ensured with the minimum amount of space required, even with high dynamic loads.

The object is achieved by the features of the independent claim. Advantageous embodiments of the invention are characterized in the subclaims.

The invention is characterized in that the outer electrodes comprise at least one region which is embodied in such a way that it compensates length variations of the piezoelectric actuator in the main oscillation direction by means of elastic deformation as a result of its design and arrangement. The elastic deformation exclusively extends inside a plane which is parallel to the main oscillation direction. Hereinafter this plane is referred to as the oscillation plane.

The outer electrode, which is formed in such a way that it enables great elastic deformation, ensures the reliable and durable contact of the piezoelectric actuator. Because of the elastic deformation in each case in an area exclusively within a plane in each case which runs parallel to the main oscillation direction of the piezoelectric actuator, a minimal space requirement is achieved.

The areas of the outer electrode are here preferably arranged in parallel, with the minimum possible spacing, to the respective side walls of the piezoelectric actuator. This results in a particularly compact type of construction. However, areas arranged differently in parallel to the main oscillation direction are also conceivable, for example, in the case of semicircular outer electrodes encompassing the piezoelectric actuator. The oscillation planes are produced by all planes which touch the semicircle tangentially.

It is particularly advantageous if the outer electrode has a comb-shaped profile with contact teeth. The contact teeth may be electroconductively connected to the metallization strip in a simple manner, for example, by means of soldering, for contacting the inner electrodes. The comb-shaped profile enables great elastic deformation between the individual soldering points. Naturally, other profile shapes which enable a high level of elastic deformation in the main oscillation direction are also conceivable, for example, a sinusoidal or triangular profile.

Exemplary embodiments of the invention are explained in more detail hereinafter with reference to the diagrams. The diagrams show:

BRIEF DESCRIPTION OF THE DRAWING

FIG. 5 a section through a piezoelectric actuator with an outer electrode glued on.

DESCRIPTION OF THE PREFERRED EMBODIMENT

Figure 1:
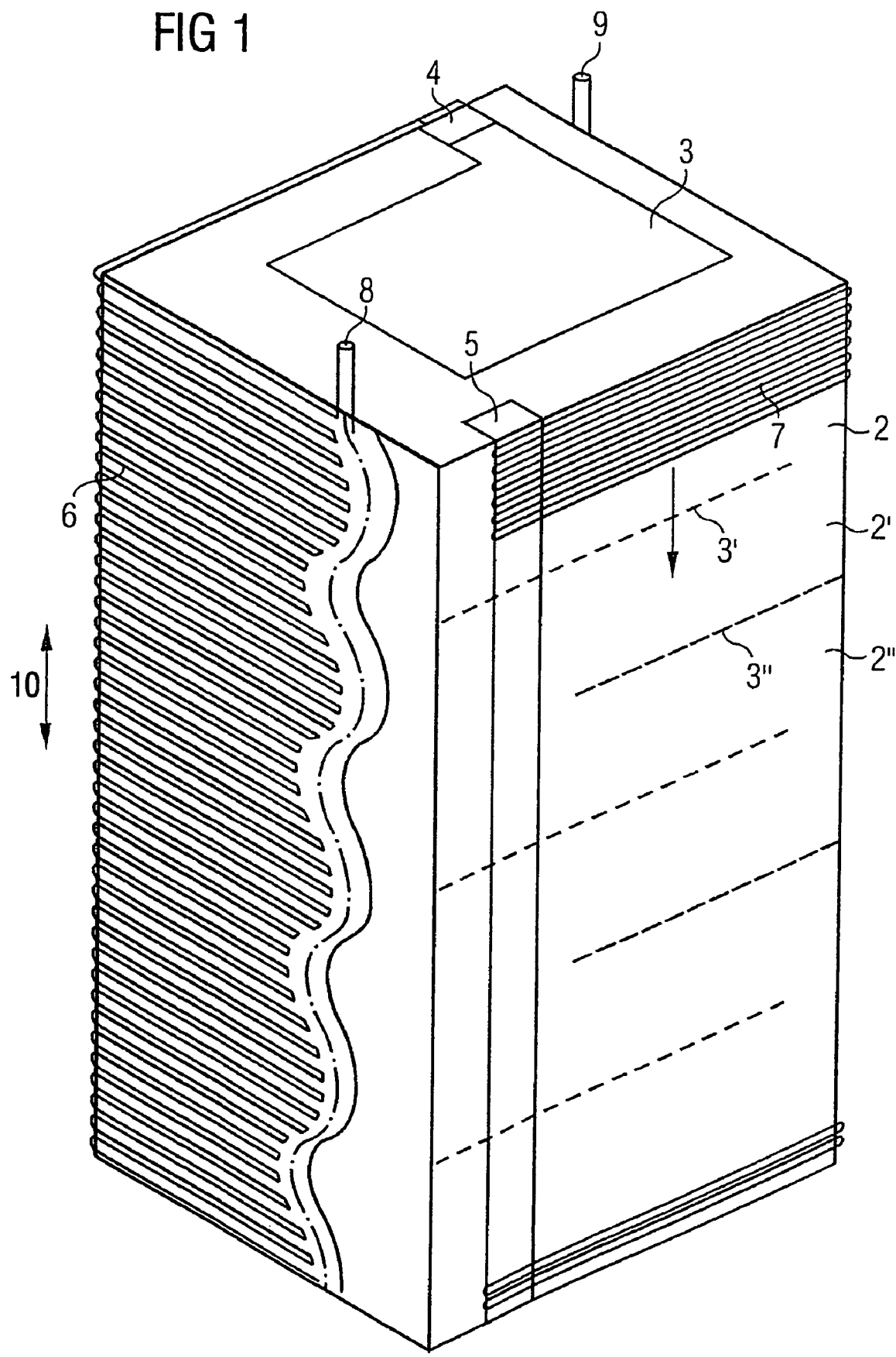
FIG. 1 a piezoelectric actuator with elastically deformable outer electrode.

Elements of the same construction and function have the same reference characters in all the figures.

FIG. 1 shows a piezoelectric actuator 1, comprising a stack of a plurality of individual piezoelectric actuator elements 2, 2', 2" which are arranged between inner electrodes 3, 3', 3". The inner electrodes 3, 3', 3" are brought out of the stack in an alternating manner and electrically connected in parallel. A first metallization strip 4 and a second metallization strip 5 are attached to the outside of the piezoelectric actuator 1 for this purpose. The inner electrodes 3, 3', 3" are respectively connected in an alternating manner to the first or the second metallization strips 4, 5. A first outer electrode 6 and a second outer electrode 7 are fixed to the first or the second metallization strips 4, 5 respectively preferably by means of soldering in order to electrically contact the piezoelectric actuator. The outer electrodes 6, 7 are connected with a first connection element 8 and a second connection element 9 for externally contacting the piezoelectric actuator 1. If an electric voltage is applied to the outer electrodes 6, 7, depending on the polarity of the voltage, the piezoelectric actuator elements expand in the direction of the field or they contract. With alternating polarity, the piezoelectric actuator thus executes a fundamental oscillation in the direction of the field.

The outer electrodes 6, 7 are preferably designed as comb-shaped pieces and attached to the piezoelectric actuator 1 in such a way that they exhibit their greatest elasticity in the main oscillation direction 10 of the piezoelectric actuator 1. In the figure the shaped pieces 6, 7 are curved for better mechanical location in such a way that they are fixed to two sides of the piezoelectric actuator 1 in each case.

Figure 2:
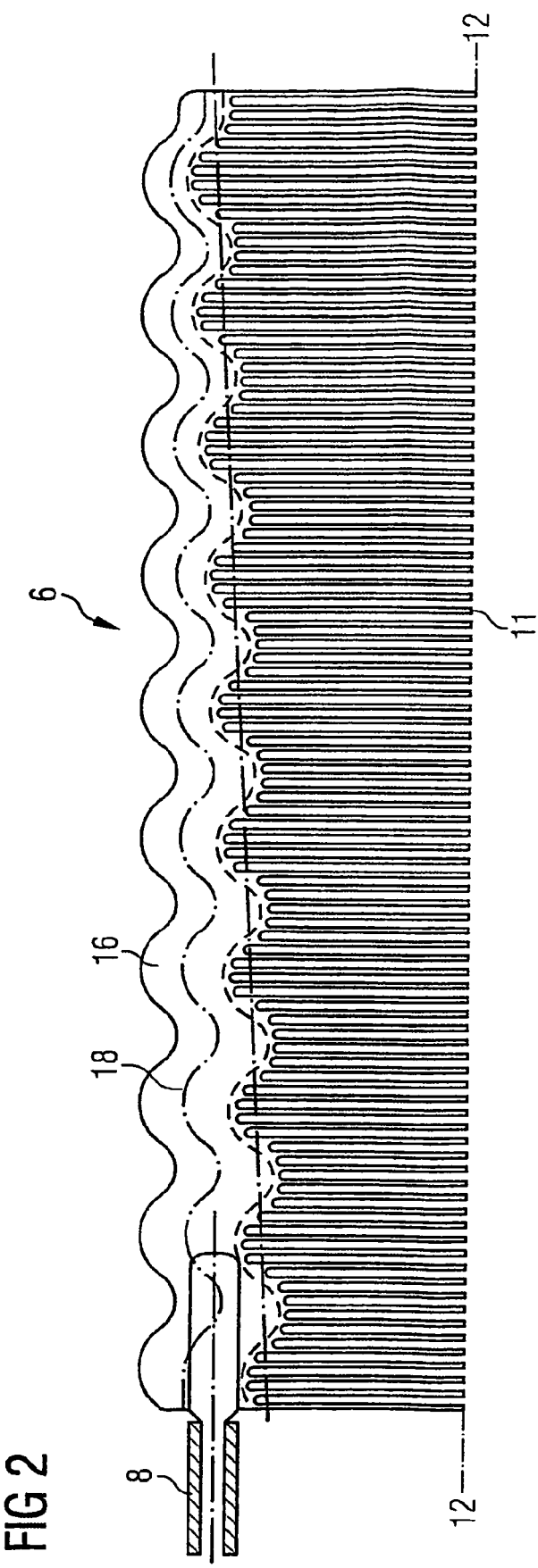
FIG. 2 an outer electrode in a plane view.

FIG. 2 shows an outer electrode 6 in the shape of a comb in a plane view. The electrical contacting of the outer electrode 6 takes place via a connection element 8. The connection element 8 is connected to a wave-form region 16 of the outer electrode 6 for this purpose. The wave-form region 16 is embodied as a conductor plate, from which individual contact teeth 11 running in parallel to one another lead away. As a result of the wave-form embodiment of the conductor plate, a high degree of elasticity is achieved in this region. The contact teeth 11 form a straight end 12. The contact teeth 11 are fixed to the metallization strip 4, preferably by means of soldering, in order to electrically contact the inner electrodes 3, 3", in the region of the straight end 12.

The current is introduced via the connection element 8 into the wave-form part 16 of the outer electrode 6 and flows via the individual contact teeth 11 and the metallization zone 4, 5 to the inner electrodes 3, 3". At the point of contact between the wave-form part 16, the outer electrode 6 and the connection element 8 the entire current is introduced into the outer electrode 6. For this reason, the wave-form part 16 has a larger cross-section at this point. As the flow of current in the wave-form part 16 of the outer electrode 6 constantly decreases along the principal axis 18 with increasing distance from the connection element 8, the cross-section of the wave-form part 16 preferably tapers along its principal axis 18. The tapering form of the wave-form part 16 of the outer electrode 6 further increases elasticity in this region.

The outer electrode 6 can preferably be manufactured from a bronze alloy (e.g. CuSn6) using etching technology.

Figure 3:
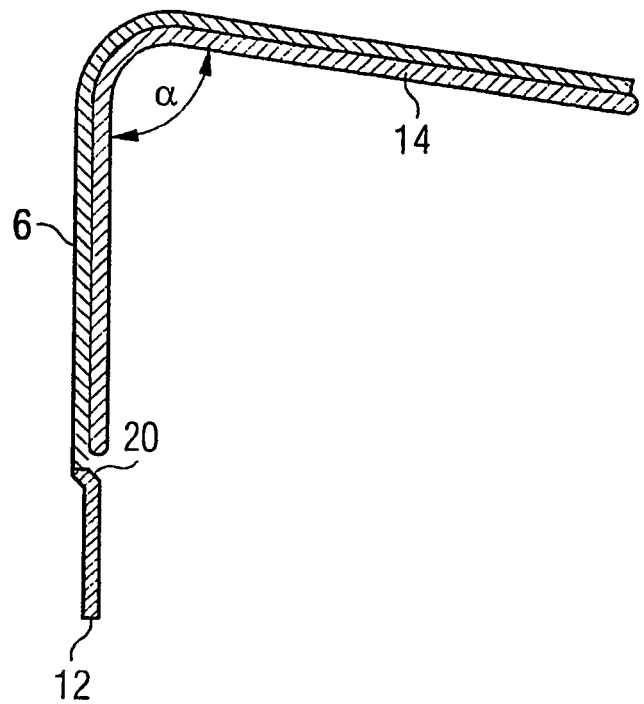
FIG. 3 a curved outer electrode with adhesive layer on one side.

FIG. 3 shows a section through the outer electrode 6. The outer electrode 6 is fixed mechanically to the piezoelectric actuator 1 by means of adhesive 14. Preferably the outer electrode 6 is bent at an angle a for fixing to the piezoelectric actuator 1, parallel to the first, straight end 12 of the contact teeth 11. Preferably the angle $\alpha$ is <90°. As a result of this, when the outer electrode 6 is pressed against the right-angled piezoelectric actuator 1 an elastic force arises which ensures that the contact teeth 11 of the outer electrode 6 abut the piezoelectric actuator 1 during the gluing process. The contact teeth 11 are soldered on in a region around the straight end 12 to the metallization zone 4 for electrical contact. This region is left clear when the adhesive 14 is applied. In order to ensure flat abutment on the metallization strip 4 in the region of the straight end 12 of the contact teeth 11, an additional offset 20 is provided which evens out the adhesive layer 14 between the shaped piece 6 and the piezoelectric actuator 1.

The thickness of the layer of adhesive 14 is determined by the admixture of particles of a preselected size. The adhesive 14 is composed in such a manner that it ensures electric insulation between the outer electrode 6 on the one hand and the piezoelectric actuator elements 2, 2', 2" and the inner electrodes 3, 3', 3" on the other hand. Thus, no additional layer of insulation is necessary, further reducing the requirement for construction space. The adhesive is permanently elastic in order to also ensure secure fixing of the outer electrode 6 during operation of the piezoelectric actuator 1.

Figure 4:
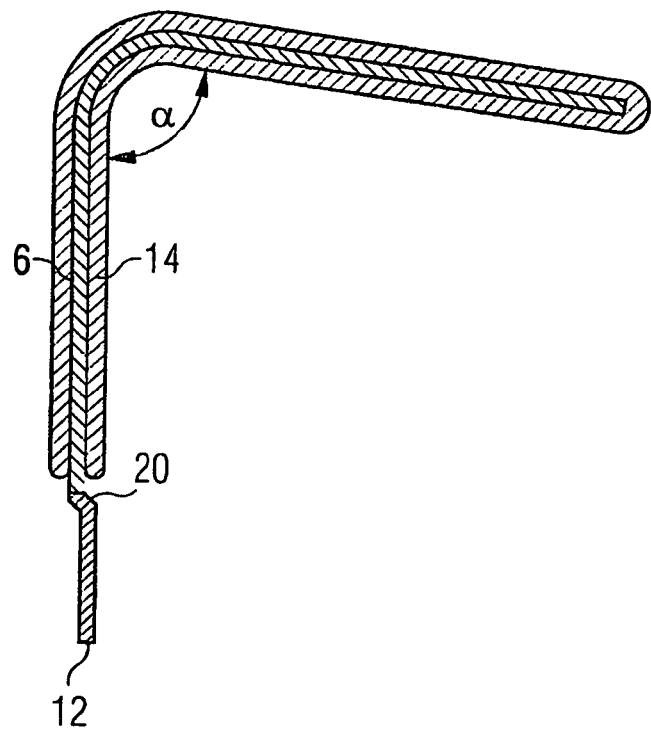
FIG. 4 a curved outer electrode with adhesive layer on both sides.

As shown in FIG. 3, the adhesive 14 can be applied on one side on the inside of the shaped piece 6 or on both sides, as shown in FIG. 4. The application of the adhesive 14 on both sides results in additional insulation of the outer electrode 6 from the external environment.

In FIGS. 2-4 only the structure of the first outer electrode 6 is described in each case. The second outer electrode 7 is identical in structure, however, so that an additional description is unnecessary.

Figure 5:
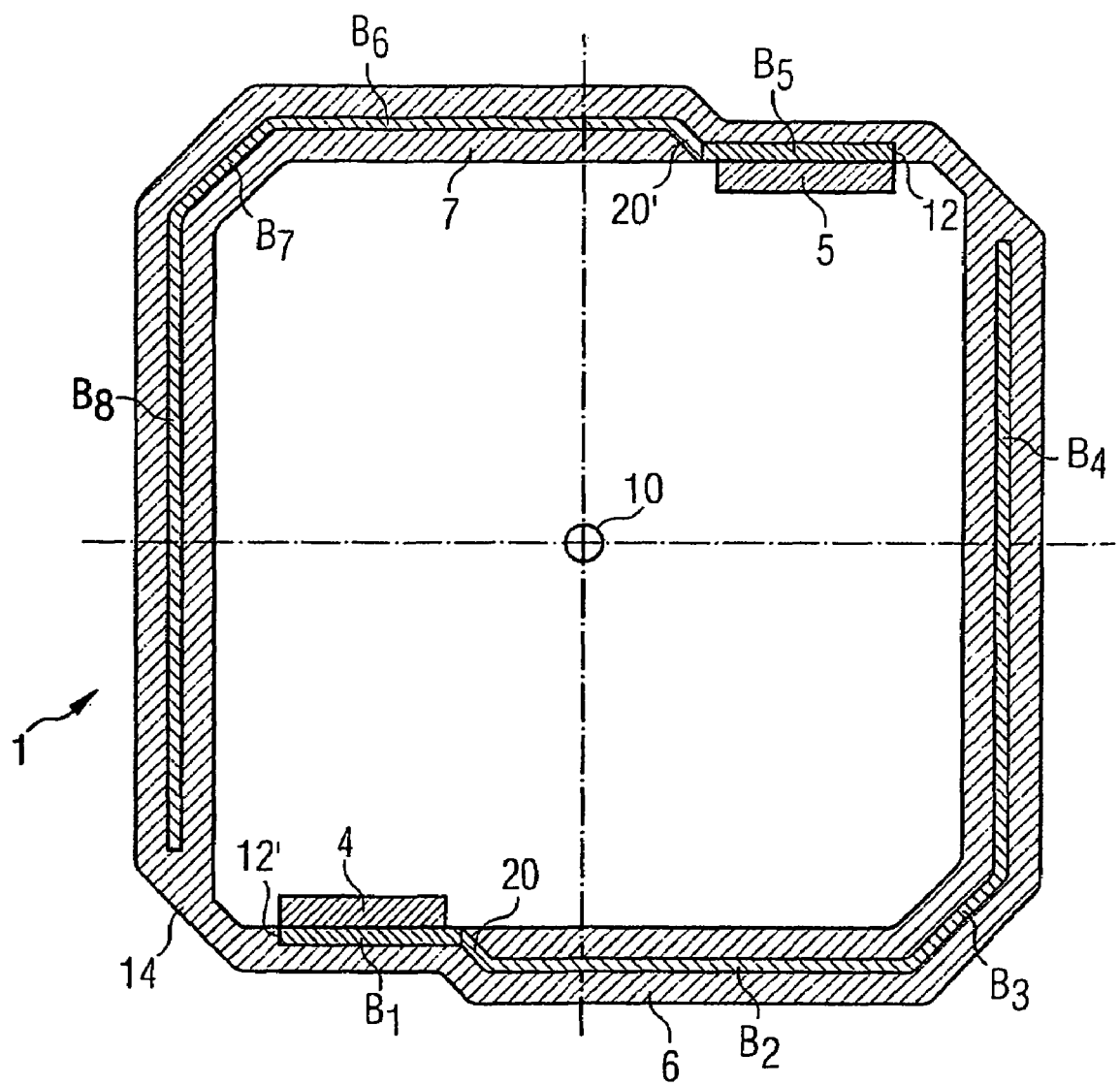

FIG. 5 shows a section through the piezoelectric actuator 1 with the glued-on outer electrodes 6, 7. The section is perpendicular to the main oscillation axis 10 of the piezoelectric actuator 1. The respective straight sections $B_1$-$B_8$ of the first and second outer electrode 6, 7 respectively represent a region of the outer electrodes which can compensate length variations of the piezoelectric actuator 1 by means of elastic deformation by virtue of their form and arrangement. The elastic deformation of the respective regions $B_1$-$B_8$ runs respectively within a plane perpendicular to the plane of the image, characterized by the respective segmented line, and parallel to the main oscillation direction 10.

After gluing on the outer electrodes 6, 7 and soldering in the region of the straight end 12, 12' of contact teeth 11, 11', the piezoelectric actuator 1 is covered in a continuous layer of adhesive 22. The continuous layer of adhesive 22 can be applied, for example, by means of immersion. This gives the piezoelectric actuator 1 full electric protection from the environment. A further advantage of this coating with adhesive is that when a fuel-resistant adhesive is used, the whole piezoelectric actuator 1 can be made fuel-resistant. This is particularly advantageous as the piezoceramic only has slight resistance to moisture. As a result of slight resistance to moisture, moisture can penetrate to the inner electrodes 3, 3', 3", which would result in a deterioration of the dielectric properties.

We claim:

1. A piezoelectric actuator, comprising:
   a stack of a plurality of individual piezoelectric actuator elements disposed between inner electrodes and selectively contracting and expanding along a main oscillation direction in dependence on an applied electric voltage;
   first and second metallization strips alternatingly connected with said inner electrodes;
   first and second outer electrodes respectively fixed to said first and second metallization strips for electrically contacting the piezoelectric actuator;
   said outer electrodes having at least one region configured for compensating for length variations of the piezoelectric actuator in a main oscillation direction by an elastic deformation thereof substantially exclusively in a plane parallel to the main oscillation direction, said outer electrodes having a comb-shaped profile with a meander-form conductor plate and contact teeth for contacting said metallization strips projecting from said conductor plate; and first and second connection elements respectively connected to said first and second outer electrodes for externally contacting the piezoelectric actuator.

2. The piezoelectric actuator according to claim 1, wherein said meander-form conductor plate is tapered along a principal axis thereof.

3. The piezoelectric actuator according to claim 1, wherein said contact teeth extend parallel to one another and have the same length at a first end, and said contact teeth at said first end are soldered to said metallization strips for establishing an electrical contact.

4. The piezoelectric actuator according to claim 1, wherein said outer electrodes are bent by an angle $\alpha < 90°$ parallel to a first, straight end region of said contact teeth, for fixing to the piezoelectric actuator.

5. The piezoelectric actuator according to claim 1, which comprises an adhesive completely covering the piezoelectric actuator.

6. The piezoelectric actuator according to claim 1, wherein said outer electrodes are formed of an etched bronze alloy.

7. The piezoelectric actuator according to claim 1, wherein said outer electrodes are mechanically fixed to the piezoelectric actuator by way of an adhesive and said contact teeth are left free of the adhesive for soldering to said metallization strips.

8. The piezoelectric actuator according to claim 7, wherein said adhesive is configured and disposed to ensure electric insulation between said outer electrodes on one side and said piezoelectric actuator elements and said inner electrodes on the other side.

9. The piezoelectric actuator according to claim 7, wherein a thickness of a layer of adhesive between said outer electrodes on one side and said piezoelectric actuator elements and said inner electrodes on the other side is determined by an admixture of particles of a preset size.

10. The piezoelectric actuator according to claim 7, wherein said adhesive is a fuel-resistant adhesive.

* * * * *